(12) United States Patent
Tao et al.

(10) Patent No.: US 6,215,193 B1
(45) Date of Patent: Apr. 10, 2001

(54) MULTICHIP MODULES AND MANUFACTURING METHOD THEREFOR

(75) Inventors: Su Tao; Meng-Hui Lin, both of Kaohsiung (TW)

(73) Assignee: Advanced Semiconductor Engineering, Inc. (TW)

( * ) Notice: Subject to any disclaimer, the term of this patent is extended or adjusted under 35 U.S.C. 154(b) by 0 days.

(21) Appl. No.: 09/295,342

(22) Filed: Apr. 21, 1999

(51) Int. Cl.[7] .......................... H01L 23/48; H01L 23/52; H01L 29/40
(52) U.S. Cl. ............................................. 257/777; 257/686
(58) Field of Search ..................... 257/777, 778, 257/686, 723, 783; 438/107, 108, 110, 109

(56) References Cited

U.S. PATENT DOCUMENTS

| | | | |
|---|---|---|---|
| 5,198,963 | * | 3/1993 | Gupta et al. . |
| 5,323,060 | | 6/1994 | Fogal et al. . |
| 5,502,289 | * | 3/1996 | Takier et al. . |
| 5,608,262 | * | 3/1997 | Degani et al. . |
| 5,614,766 | * | 3/1997 | Takachi et al. . |
| 5,715,144 | * | 2/1998 | Ameen et al. . |
| 5,760,478 | * | 6/1998 | Bozso et al. . |
| 5,790,384 | * | 8/1998 | Ahmad et al. . |
| 5,804,004 | | 9/1998 | Tuckerman et al. . |
| 5,808,878 | * | 9/1998 | Saito et al. . |
| 5,869,894 | * | 2/1999 | Degani et al. . |
| 5,926,379 | * | 7/1999 | Cadet et al. . |
| 5,939,782 | * | 8/1999 | Malladi . |
| 5,949,135 | * | 9/1999 | Washida et al. . |
| 5,977,640 | * | 11/1999 | Bertin et al. . |
| 6,051,886 | * | 4/2000 | Fogal et al. . |
| 6,084,308 | * | 7/2000 | Kelkar et al. . |

* cited by examiner

Primary Examiner—Sheila V. Clark
(74) Attorney, Agent, or Firm—Dykema Gossett PLLC

(57) ABSTRACT

A multichip module includes a substrate having two padding strips, a first chip, and a second chip mounted thereon. The padding strips are mounted to two sides of the first chip. The second chip is disposed above the first chip in a manner that the bonding pads of the first chip are exposed outside the lateral edges of the second chip. In another embodiment of the invention, the substrate includes a recess, a first chip, and a second chip. The first chip is received in the first chip, and the second chip is disposed above the first chip in a manner that the bonding pads of the first chip are exposed outside the lateral edges of the second chip. A method is provided to manufacture a multichip module by placing a first chip on a substrate and then placing a second chip above the first chip in a manner that the bonding pads of the first chip are exposed outside the lateral edges of the second chip.

8 Claims, 5 Drawing Sheets

MULTICHIP MODULES AND MANUFACTURING METHOD THEREFOR

BACKGROUND OF THE INVENTION

1. Field of the Invention

The present invention relates to multichip modules (MCM) and a manufacturing method therefor, and more particularly to multichip modules and a manufacturing method in which a recess is provided in a substrate during manufacturing of the substrate of a ball grid array integrated circuit for receiving an integrated circuit or memory stack.

2. Description of the Related Art

In order to reduce the volume of an electric device, integrated circuits are packaged in stacks to form a multichip module to reduce the surface area of the substrate occupied by the electric device.

U.S. Pat. No. 5,323,060 to Fogal et al. issued on Jun. 21, 1994 discloses a multichip module having a stacked chip arrangement. In this patent, as shown in FIG. 1 of the drawings that corresponds to FIG. 1 of U.S. Pat. No. 5,323,060, the multichip includes a substrate 100, a first multichip stack 110, and a second multichip stack 120. The first multichip stack 110 includes a first chip 112 mounted to a bonding area 111 of the substrate 100. An adhesive layer 113 is applied to upper face of the first chip 112. A second chip 114 is then mounted on top of the adhesive layer 113, thereby forming a multichip stack with two chips. A number of bonding wires 115 interconnect bonding pads of the chips 112 and 114 and bonding pads of the substrate 100. The adhesive layer 113 must have a thickness of "A" to allow connection between the bonding wires 115 and the bonding pads of the chips 112 and 114. The second multichip stack 120 includes a first chip 122 mounted to a bonding area 121 of the substrate 100. A first adhesive layer 123 is applied to upper face of the first chip 121. A second chip 124 is mounted on top of the first adhesive layer 123, and a second adhesive layer 125 is then applied to upper face of the second chip 124. Next, a third chip 126 is mounted on top of the second adhesive layer 125, and a third adhesive layer 127 is applied to upper face of the third chip 126 for mounting a further chip, thereby forming a multichip stack with many chips. A number of bonding wires 128 interconnect bonding pads of the chips 122, 124, and 126 and bonding pads of the substrate 100. The adhesive layers 123, 125, and 127 must have a thickness of "A" to allow connection between the bonding wires 128 and the bonding pads of the chips 122, 124, and 126. Nevertheless, the adhesive layers 113, 123, 125, and 127 must have a thickness of "A" to prevent the chips 114, 124, or 126 from making contact with the underlying bonding wires 115 or 128. Yet the increase in the thickness of the adhesive layers 113, 123, 125, and 127 results an obstacle to heat transfer from the chips 114, 124, and 126 to the underlying chips. The heat dissipating effect is accordingly poor.

U.S. Pat. No. 5,804,004 to Tuckerman et al. issued on Sep. 8, 1998 discloses stacked devices for multichip modules. In this patent, as shown in FIGS. 2 and 3 of the drawings that correspond to FIGS. 4A and 4B of U.S. Pat. No. 5,804,004, the multichip includes a substrate 200, and a first chip 211 is mounted to upper face of the substrate 200 by an adhesive layer ai 210. Bonding pads 215 of the first chip 211 are connected to bonding pads 201 of the substrate 200 by bonding wires 214. A second chip 212 is mounted to upper face of the first chip 211 by an adhesive layer 210. Bonding pads 215 of the second chip 212 are connected to bonding pads 202 of the substrate 200 by bonding wires 214. Bonding wires 214 are prevented from making contact with the adjacent upper chip 212 by beveling the edge of the upper second chip 212. A third chip 213 is mounted to upper face of the second chip 212 by an adhesive layer 210. Bonding pads 215 of the third chip 213 are connected to bonding pads 203 of the substrate 200 by bonding wires 214. Bonding wires 214 are prevented from making contact with the adjacent upper chip 213 by beveling the edge of the upper third chip 213. Nevertheless, beveling of the edge of the chip 212, 213 results in difficulty in manufacturing.

SUMMARY OF THE INVENTION

It is a primary object of the present invention to provide a multichip module that includes a substrate having two padding strips to allow a chip or an electric device to be mounted between the padding strips in a manner that the upper face does not extend beyond the padding strips. The padding strips provide a cushioning effect for the chip or electric device during wire bonding procedure of the chip or electric device.

It is a secondary object of the present invention to provide a multichip module that includes a substrate having a recess for receiving a chip or electric device such that the chip or electric device is "sunk" into the substrate in a manner that the upper face does not extend beyond the substrate. Another chip or electric device is mounted above this chip or electric device, yet the overall height of the multichip module thus formed is reduced.

It is a further object of the present invention to provide a method for manufacturing a multichip module, wherein bonding pads of a lower chip are exposed outside lateral edges of an upper chip to allow easy wire bonding and to avoid the bonding wires from making contact with the upper chip. In addition, the thickness of the adhesive layers between the upper chip and the lower chip is reduced to allow easy heat conduction from the upper chip to the lower chip and to avoid flush of adhesive from an area between the upper chip and the lower chip to an area beyond the upper chip and the lower chip.

In accordance with the present invention, a substrate includes two padding strips, a first chip, and a second chip. The padding strips are mounted on both sides of the first chip. An adhesive layer is applied to a lower face of the first chip so as to be adhered to the substrate. A further adhesive layer is applied to an upper face of the first chip for adherence with a lower face of the second chip. Bonding pads on two ends of the first chip between the padding strips extend beyond the lateral edges of the second chip rather than being covered by the second chip. Wire bonding of bonding pads on two ends of the first chip is convenient as not being affected by the second chip. In addition, the padding strips provide a cushioning effect when the first chip is subjected to forces during wire bonding of the second chip, thereby making the first chip more reliable.

In another preferred embodiment of the invention, the substrate includes a single padding strip for stacking the second chip above the first chip. Bonding pads on two ends of the first chip extend beyond the lateral edges of the second chip rather than being covered by the second chip. Wire bonding of bonding pads on two ends of the first chip is convenient as not being affected by the second chip. In addition, the padding strip provides a cushioning effect when the first chip is subjected to forces during wire bonding of the second chip, thereby making the first chip more reliable.

In a further preferred embodiment of the invention, the substrate includes a recess for receiving a first chip, and a second chip is stacked above the first chip. Provision of the recess reduces the overall height of the multichip module of the invention and shortens the length of the bonding wires for connecting the bonding pads of the first chip and the bonding pads of the substrate. Two side adhesive layers are applied to both sides of the recess for stacking the second chip in a manner that bonding pads on two ends of the first chip extend beyond the lateral edges of the second chip rather than being covered by the second chip. Wire bonding of bonding pads on two ends of the first chip is convenient as not being affected by the second chip. In addition, both sides of the recess provide a cushioning effect when the first chip is subjected to forces during wire bonding of the second chip, thereby making the first chip more reliable.

A method for manufacturing a multichip module in accordance with the present invention includes the step of exposing bonding pads of a lower chip outside the lateral edges, of an upper chip, thereby providing a convenient wire bonding procedure and avoiding the bonding wires of the lower chip from making contact with the upper chip. The thickness of adhesive layers between the upper chip and the lower chip is reduced to allow easy heat conduction from the upper chip to the lower chip and to avoid flush of adhesive from an area between the upper chip and the lower chip to an area beyond the upper chip and the lower chip. The upper chip and the lower chip are stacked in a cross manner such that when a further chip is stacked above the upper chip, the thickness of the upper chip avoids bonding wires of the lower chip from being damaged by said further chip.

Other objects, advantages, and novel features of the invention will become more apparent from the following detailed description when taken in conjunction with the accompanying drawings.

DETAILED DESCRIPTION OF THE PREFERRED EMBODIMENTS

Figure 4:
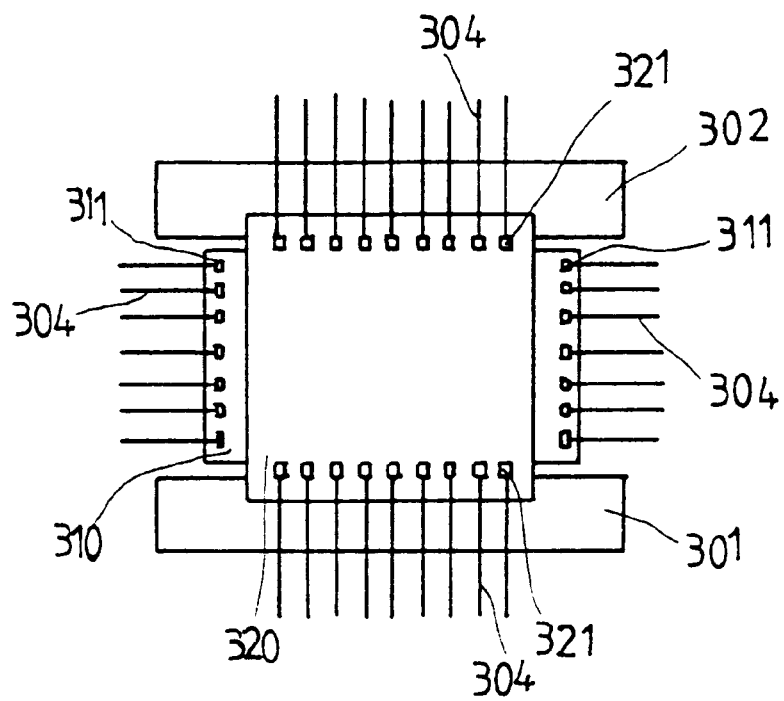
FIG. 4 is a top view of a first preferred embodiment of a multichip module in accordance with the present invention.
Figure 5:
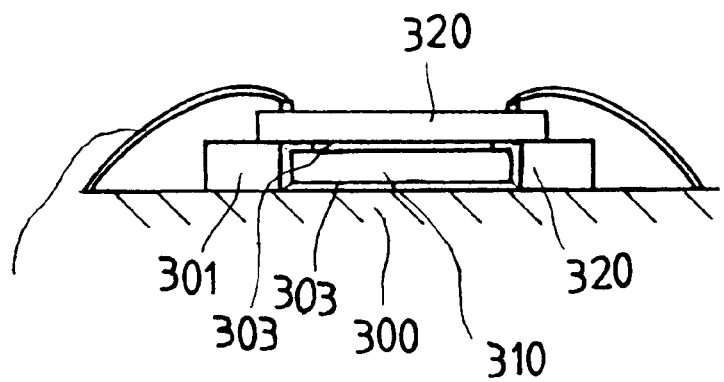
FIG. 5 is a side view of the first preferred embodiment of a multichip module in accordance with the present invention.

Referring to FIGS. 4 and 5, a first embodiment of a multichip module in accordance with the present invention includes a substrate 300 having a first padding strip 301, a second padding strip 302, a first chip 310, and a second chip 320 mounted thereon. The first chip 310 is mounted between the padding strips 301 and 302. The second chip 320 is stacked above the first chip 310, the first padding strip 301, and the second padding strip 302. The padding strips 301 and 302 are preferably adhesive tapes. Each chip 310, 320 has a number of bonding pads 311 and 321 for soldering with bonding wires 304, thereby interconnecting the first chip 310 and the second chip 320 with circuit on the substrate 300.

Still referring to FIGS. 4 and 5, an adhesive layer 303 is applied to a lower face of the first chip 310 so as to be adhered to the substrate 300. A further adhesive layer 303 is applied to an upper face of the first chip 310 for adherence with a lower face of the second chip 320. Two lateral sides of the second chip 320 are located on tops of the padding strips 301 and 302. In addition, bonding pads 311 on two ends of the first chip 310 between the padding strips 301 and 302 extend beyond the lateral edges of the second chip 320 rather than being covered by the second chip 320. Thus, the wire bonding procedure of the bonding wires 304 to the bonding pads 311 on two ends of the first chip 310 is convenient as not being affected by the second chip 320. In addition, the padding strips 301 and 302 provide a cushioning effect when the first chip 310 is subjected to forces during wire bonding of the second chip 320, thereby making the first chip 310 more reliable.

Figure 1:
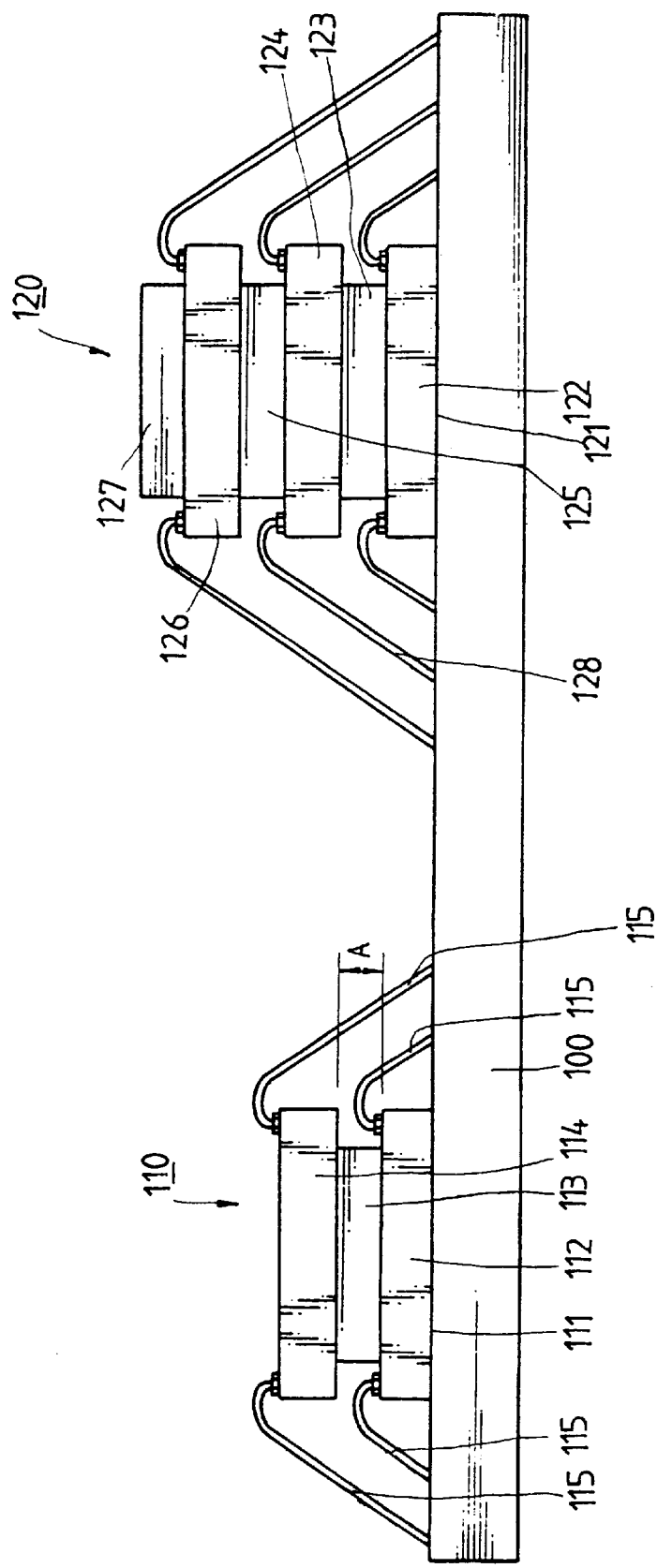
FIG. 1 is a side view of a conventional multichip module.

Comparing FIG. 1 with FIG. 5, the adhesive layers 113, 123, 125, and 127 of U.S. Pat. No. 5,323,060 must have a thickness of "A" to prevent the chips 114, 124, or 126 from contacting with the underlying bonding wires 115 or 128. Yet the increase in the thickness of the adhesive layers 113, 123, 125, and 127 results an obstacle to heat transfer from the chips 114, 124, and 126 to the underlying chips. To the contrary, in the multichip module of the invention, the bonding pads 311 on two ends of the first chip 310 between the padding strips 301 and 302 extend beyond the lateral edges of the second chip 320 rather than being covered by the second chip 320. The wire bonding of the bonding pads 311 on two ends of the first chip 310 is convenient as not being affected by the second chip 320. In addition, the thickness of the adhesive layer 303 of the invention is reduced such that heat transfer may be conducted from the second chip 320 to the first chip 310 via the thinner adhesive layer 303, thereby providing a better heat dissipating effect. Accordingly, the multichip module of the invention is easy to proceed with wire bonding and has a better heat dissipating effect when compared with that disclosed in U.S. Pat. No. 5,323,060.

Figure 2:
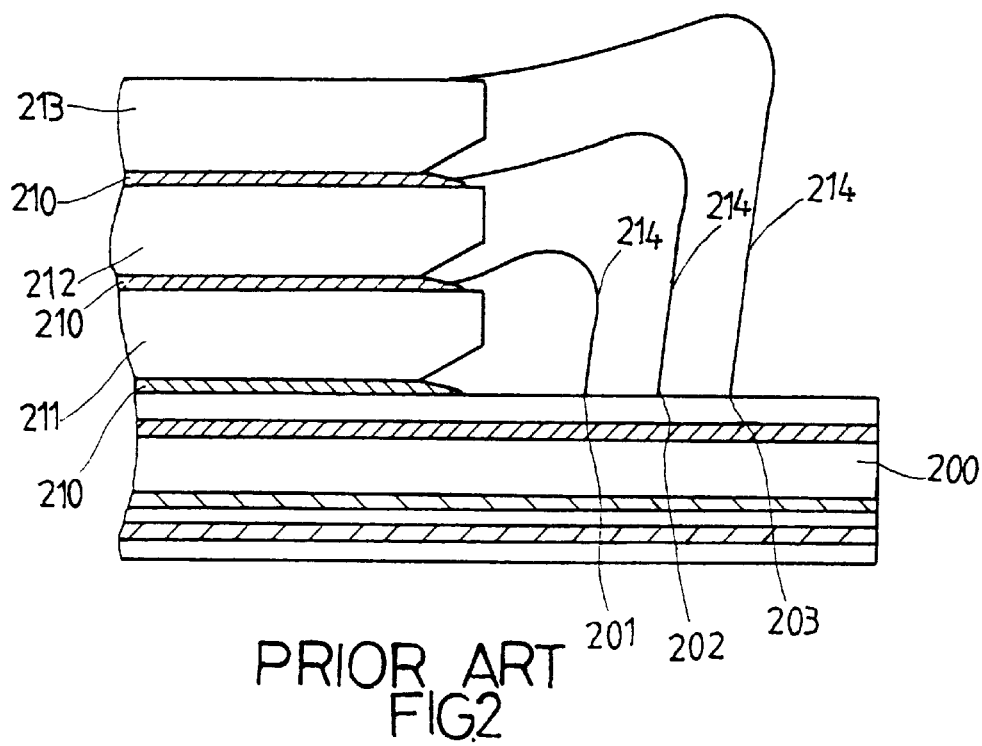
FIG. 2 is a side view of another conventional multichip module.
Figure 3:
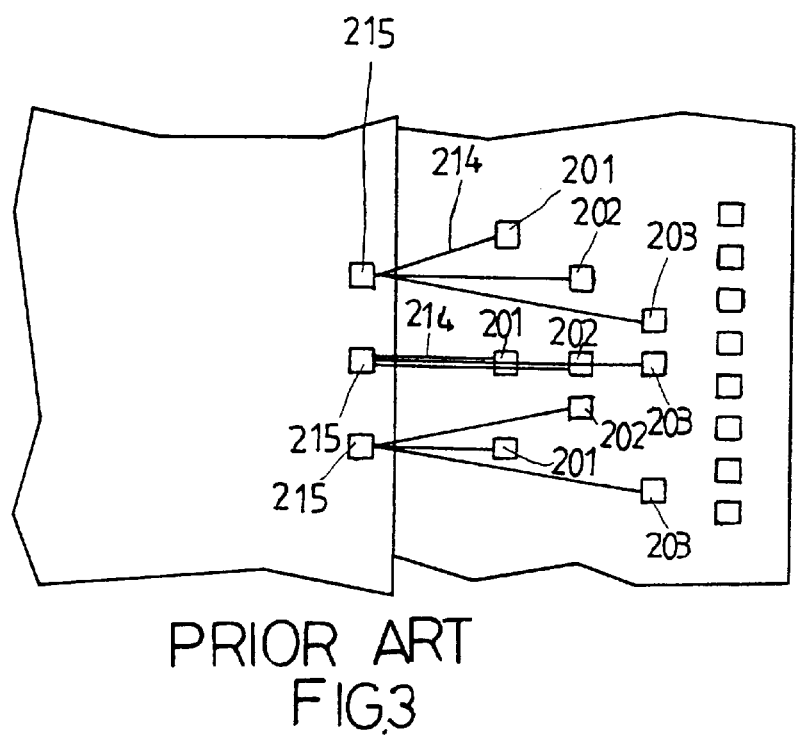
FIG. 3 is a top view of the conventional multichip module in FIG. 2.

Comparing FIG. 2 with FIG. 5, the chip 211, 213 of U.S. Pat. No. 5,804,004 must be beveled in an edge thereof to prevent from making contact with the bonding wires 214 of an underlying chip 212, 211. To the contrary, the bonding pads 311 on two ends of the first chip 310 between the padding strips 301 and 302 extend beyond the lateral edges of the second chip 320 rather than being covered by the second chip 320. Thus, the trouble processing of edge beveling in the chips is avoided in the multichip module of the invention. Accordingly, the multichip module of the invention is easier to manufacture when compared with that disclosed in U.S. Pat. No. 5,804,004.

It is appreciated that the method for stacking the second chip 320 above the first chip 310 can be continued to form a multichip module with a plurality of chips.

Figure 6:
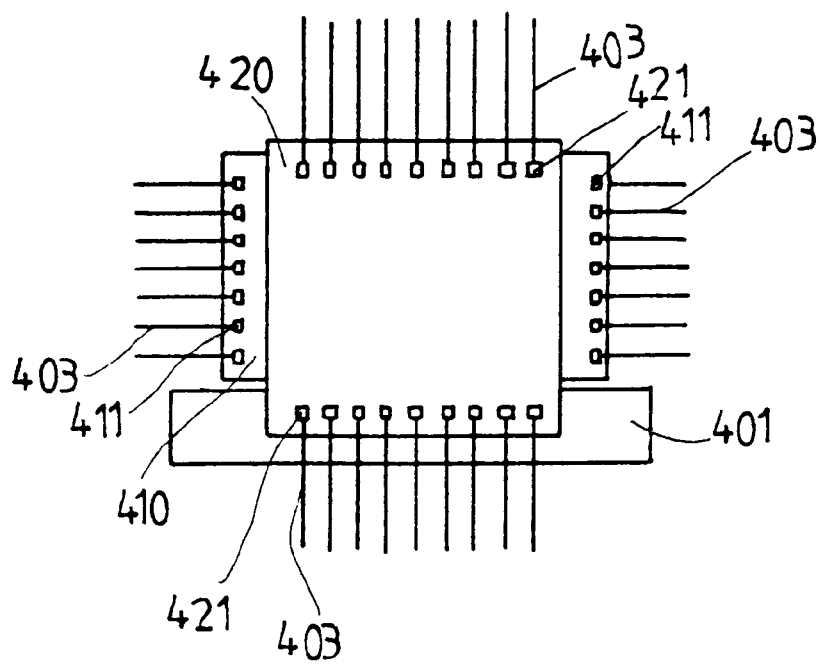
FIG. 6 is a top view of a second preferred embodiment of a multichip module in accordance with the present invention.
Figure 7:
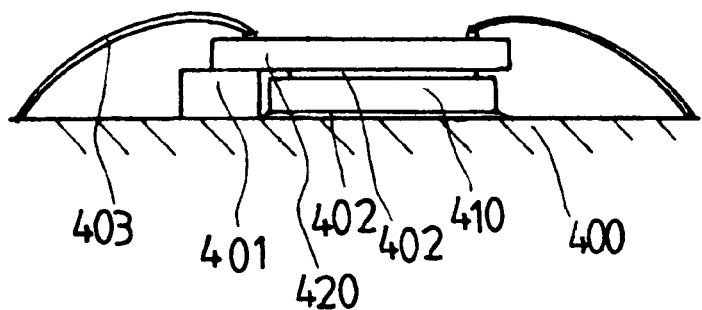
FIG. 7 is a side view of the second preferred embodiment of a multichip module in accordance with the present invention.

Referring to FIGS. 6 and 7, a second preferred embodiment of the multichip module of the invention includes a substrate 400 having a padding strip 401, a first chip 410, and a second chip 420 mounted thereon. The first chip 410 is mounted adjacent to a side of the padding strip 401, and the second chip 420 is stacked above the first chip 410 and the padding strip 401. The padding strip 401 is preferably an adhesive tape. Each chip 410, 420 has a number of bonding pads 411 and 421 for soldering with bonding wires 403, thereby is interconnecting the first chip 410 and the second chip 420 with circuitry on the substrate 400.

Still referring to FIGS. 6 and 7, an adhesive layer 402 is applied to a lower face of the first chip 410 so as to be adhered to the substrate 400. A further adhesive layer 402 is applied to an upper face of the first chip 410 for adherence with a lower face of the second chip 420. A lateral side of the second chip 420 is located on top of the padding strip 401. Thus, the substrate 400 provides a single padding strip 401 for stacking the second chip 420. In addition, bonding pads 411 on two ends of the first chip 410 extend beyond the lateral edges of the second chip 420 rather than being covered by the second chip 420. Thus, the wire bonding procedure of the bonding wires 403 to the bonding pads 411 on two ends of the first chip 410 is convenient as not being affected by the second chip 420. In addition, the padding strip 401 provides a cushioning effect when the first chip 410 is subjected to forces during wire bonding of the second chip 420, thereby making the first chip 410 more reliable.

Figure 8:
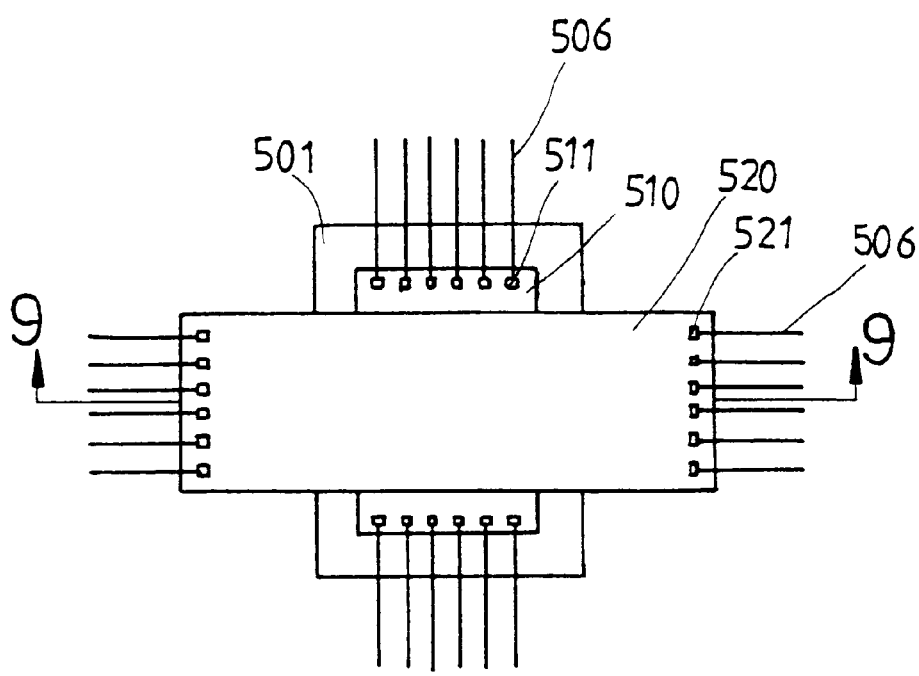
FIG. 8 is a top view of a third preferred embodiment of a multichip module in accordance with the present invention.
Figure 9:
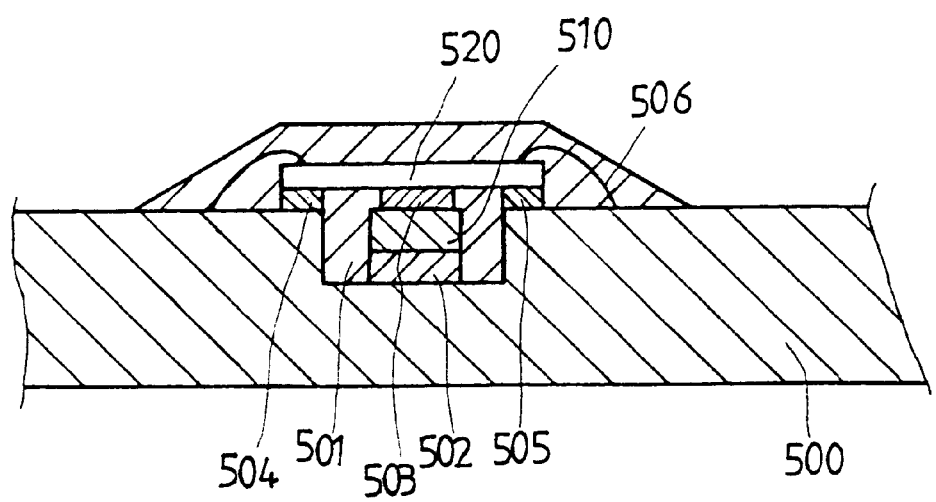
FIG. 9 is a sectional view taken along line 9—9 in FIG. 8.

Referring to FIGS. 8 and 9, a third preferred embodiment the multichip module of the invention includes a substrate 500 having a recess 501, a first side adhesive layer 504, a second side adhesive layer 505, a first chip 510, and a second chip 520. As can be seen from FIGS. 8 and 9, the first chip 510 is received in the recess 501, and a first adhesive layer 502 is applied to a lower face of the first chip 510 so as to be adhered to a bottom of the recess 501. A second adhesive layer 503 is applied to an upper face of the first chip 510 for adherence to a lower face of the second chip 520. The first side adhesive layer 504 and the second side adhesive layer 504 are applied to both sides of the recess. The lower face of the second chip 520 above the first chip 510 is adhered to the side adhesive layers 504 and 504 and the adhesive layer 503 on the first chip 510 in a manner that bonding pads 511 on two ends of the first chip 510 extend beyond the lateral edges of the second chip 520 rather than being covered by the second chip 520. Thus, the wire bonding procedure of bonding wires 506 to the bonding pads 511 on two ends of the first chip 510 is convenient as not being affected by the second chip 520. In addition, both sides of the recess 501 provide a cushioning effect when the first chip 510 is subjected to forces during wire bonding of the second chip 520, thereby making the first chip 510 more reliable. Provision of the recess 501 reduces the overall height of the multichip module of the invention and shortens the length of the bonding wires 506 for connecting the bonding pads 511 of the first chip 510 and the bonding pads of the substrate 500 to thereby increase the speed for transmitting signals.

Comparing FIGS. 1 and 2 with FIGS. 8 and 9, the third embodiment of the multichip module of the invention has advantages of reduced height and shortened bonding wires when compared with that disclosed in U.S. Pat. No. 5,804,004.

Referring to FIGS. 4, 6, and 8, a method for manufacturing a multichip module: in accordance with the present invention includes the step of exposing bonding pads 311, 411, 511 of a lower chip (the first chip) 310, 410, 510 outside the lateral edges of an upper chip (the second chip) 320, 420, 520, thereby providing a convenient wire bonding procedure and avoiding the bonding wires 304, 403, 506 of the lower chip 310, 410, 510 from making contact with the upper chip 320, 420, 520. The thickness of the adhesive layers between the upper chip 320, 420, 520 and the lower chip 320, 420, 520 is reduced to allow easy heat conduction from the upper chip 320, 420, 520 to the lower chip 310, 410, 510 and to avoid flush of adhesive from an area between the upper chip 320, 420, 520 and the lower chip 310, 410, 510 to an area beyond the upper chip 320, 420, 520 and the lower chip 310, 410, 510. The upper chip 320, 420, 520 and the lower chip 310, 410, 510 are stacked in a cross manner such that when a further chip (not shown) is stacked above the upper chip 320, 420, 520, the thickness of the upper chip 320, 420, 520 avoids bonding wires of the lower chip 310, 410, 510 from being damaged by said further chip. Accordingly, the cross-stacking method in accordance with the present invention allows continuing stacking of further chips above the upper chip (the second chip) 320, 420, 520, thereby forming a multichip module with many chips.

Although the invention has been explained in relation to its preferred embodiment, it is to be understood that many other possible modifications and variations can be made without departing from the spirit and scope of the invention as hereinafter claimed.

What is claimed is:

1. A multichip module comprising:
   a substrate including an upper face;
   a first padding strip mounted to the upper face of the substrate;
   a first chip including a plurality of bonding pads on an upper face thereof, the first chip being adhered to the upper face of the substrate by a first adhesive layer in an area adjacent to a side of the first padding strip; and
   a second chip including two lateral edges and a plurality of bonding pads on an upper face thereof, the second chip being adhered to the first padding strip and the upper face of the first chip by a second adhesive layer;
   wherein the bonding pads of the first chip are exposed outside the lateral edges of the second chip.

2. The multichip module as claimed in claim 1, further comprising a second padding strip arranged in a manner that the first chip is located between the first padding strip and the second padding strip, and the second chip is mounted above the first chip, the first padding strip and the second padding strip.

3. The multichip module as claimed in claim 2, wherein the first padding strip and the second padding strip are adhesive tapes.

4. A multichip module comprising:
   a substrate including a recess in an upper face thereof, the recess including a bottom;
   a first chip including a plurality of bonding pads on an upper face thereof, the first chip being adhered to the bottom of the recess by a first adhesive layer; and
   a second chip including two lateral edges and a plurality of bonding pads on an upper face thereof, the second chip being adhered to the upper face of the first chip by a second adhesive layer;
   wherein the bonding pads of the first chip are exposed outside the lateral edges of the second chip.

5. The multichip module as claimed in claim 4, further comprising two side adhesive layers applied to two lateral sides of the recess, and wherein the second chip has a lower face with two ends disposed on the side adhesive layers.

6. The method for manufacturing a multichip module as claimed in claim 7, wherein the first chip and the second chip are stacked in a cross manner.

7. A method for manufacturing a multichip module, comprising the steps of:

providing a substrate including an upper face;

adhering a first padding strip to the upper face of the substrate;

mounting a first chip on the upper face of the substrate by a first adhesive layer in an area adjacent to a side of the first padding strip, the first chip including a plurality of bonding pads on an upper face thereof; and mounting a second chip the first padding strip and the upper face of the first chip by a second adhesive layer, the second chip including two lateral edges and a plurality of bonding pads on an upper face thereof, wherein the bonding pads of the first chip are exposed outside the lateral edges of the second chip.

8. The method for manufacturing a multichip module as claimed in claim 7, further comprising disposing a second padding strip arranged in a manner that the first chip is located between the first and second padding strips and the second chip is mounted above the first chip, the first padding strip and the second padding strip.

* * * * *